United States Patent [19]

Peterson

[11] 3,895,280

[45] July 15, 1975

[54] ELECTRONIC CONTROLLER WITH REMOTE TUNING

[75] Inventor: Neal D. Peterson, North Easton, Mass.

[73] Assignee: The Foxboro Company, Foxboro, Mass.

[22] Filed: June 19, 1974

[21] Appl. No.: 480,603

Related U.S. Application Data

[63] Continuation of Ser. No. 234,581, March 14, 1972, abandoned.

[52] U.S. Cl. ................ 318/610; 318/599; 318/621; 328/127

[51] Int. Cl. .......................................... G05b 11/42

[58] Field of Search ........ 328/127, 71, 69; 318/609, 318/610, 621, 599

[56] References Cited

UNITED STATES PATENTS

| | | | |
|---|---|---|---|
| 3,505,606 | 4/1970 | Werner | 318/609 X |
| 3,696,282 | 10/1972 | Hirokawa et al. | 318/610 X |
| 3,741,474 | 6/1973 | Kawada et al. | 318/610 X |
| 3,748,565 | 7/1973 | Wilson et al. | 318/609 |

*Primary Examiner*—John Zazworsky
*Attorney, Agent, or Firm*—Parmelee, Johnson & Bollinger

[57] ABSTRACT

The time constant of an electronic integrator is made variable by inserting a pulse controlled FET switch in series with the input resistance. This integrator is used to generate the integral and derivative terms in an electronic process controller so that the time-constants of those terms may be varied remotely by a series of pulses or by a voltage that controls a pulse generator. An amplifier whose gain is made variable by alternately shorting the gain to zero with a switch controlled by a series of pulses is used to provide adjustable gain of the proportional band circuit in the controller. These circuits are also used in a lead lag unit.

3 Claims, 13 Drawing Figures

ELECTRONIC CONTROLLER WITH REMOTE TUNING

This is a continuation of application Ser. No. 234,581 filed Mar. 14, 1972 and now abandoned.

BACKGROUND OF THE INVENTION

1. Field of the Invention

This invention relates to electronic circuits utilized to generate an output signal that is the integral of the input signal. This invention further relates to electronic process controllers utilizing such circuits wherein the electronic controller is contained in the feedback loop of a process to generate a control signal in response to the deviation between a measurement signal and a set point signal. This invention relates to such controllers of the type wherein the control signal is proportional to the deviation signal and contains terms related to the integral of the deviation signal and the derivative of the measurement signal. This invention further relates to such controllers wherein the gain of the proportional band circuit and the time constants of the integral and derivative terms are adjustable. In addition this invention also relates to circuits for generating other dynamic functions such as a lead-lag circuit. This invention is particularly applicable to control systems using more than one loop where it is necessary or desirable to group the adjustments of the controllers in a central panel or display area possibly away from the process and even the controllers. This invention is also suited for use in multiloop control systems where the controller parameters are to be adjusted by a separate entity such as a digital computer. In particular, the instant invention is well suited for use in an adaptive control system wherein the control parameters are automatically adjusted in a predetermined manner dependent upon the shape of the current controller signal in response to an upset. This invention also relates to controllers with adjustable parameters for use in areas where environmental qualities such as humidity of dust adversely affect electronic instrumentation.

2. Description of the Prior Art

The conventional method for adjusting the time constant of an integrator is to vary either the resistive or capacitive component. In control systems the conventional method has been to vary the input resistance to the integrator with a potentiometer or a series of switches leading to fixed discrete resistors. The main problems with this approach are that the high impedances necessary for the required time constants make leakage currents due to environmental degradation of sufficient magnitude to adversely affect control. Further, the mechanical potentiometer or switch required prevents packaging of the instrumentation to prevent degradation by the environment. Thirdly, the mechanical arrangement prevents adjustment of the control parameters from a remote location or even automatic adjustment of the parameters by the controller itself.

Dynamic compensators or lead-lag circuits have used the same methods to adjust their parameters.

SUMMARY OF THE INVENTION

It is an object of the invention to provide an electronic integrator with a remotely variable time constant. It is a further object of this invention to provide an electronic controller incorporating such an integrator to generate the integral and derivative terms. It is a further object of this invention to provide such a controller wherein the proportional, integral and derivative terms are remotely adjustable by electrical signals. It is still a further object of the instant invention to provide such a controller suitable for use in contaminated atmospheres and also compatible with digital computers.

These and other objects of the instant invention are accomplished by providing an electronic controller wherein the integral and derivative terms are generated electrically by separate electronic integrators whose time constants are effectively altered by a series of pulses that may be locally or remotely generated and whose proportional term is generated by electronic circuitry with a remotely variable gain. In particular, a pulse controlled switch is provided in the inputs of the integrators and in the input and output of the proportional stage. A constant pulse-width, variable pulse-spacing pulse generator is provided to control the integrators and a constant frequency generator with variable duty cycle is provided to control the proportional stage. The same circuits are also rearranged to provide a lead lag function.

PREFERRED EMBODIMENTS

FIG. 1

Figure 1:
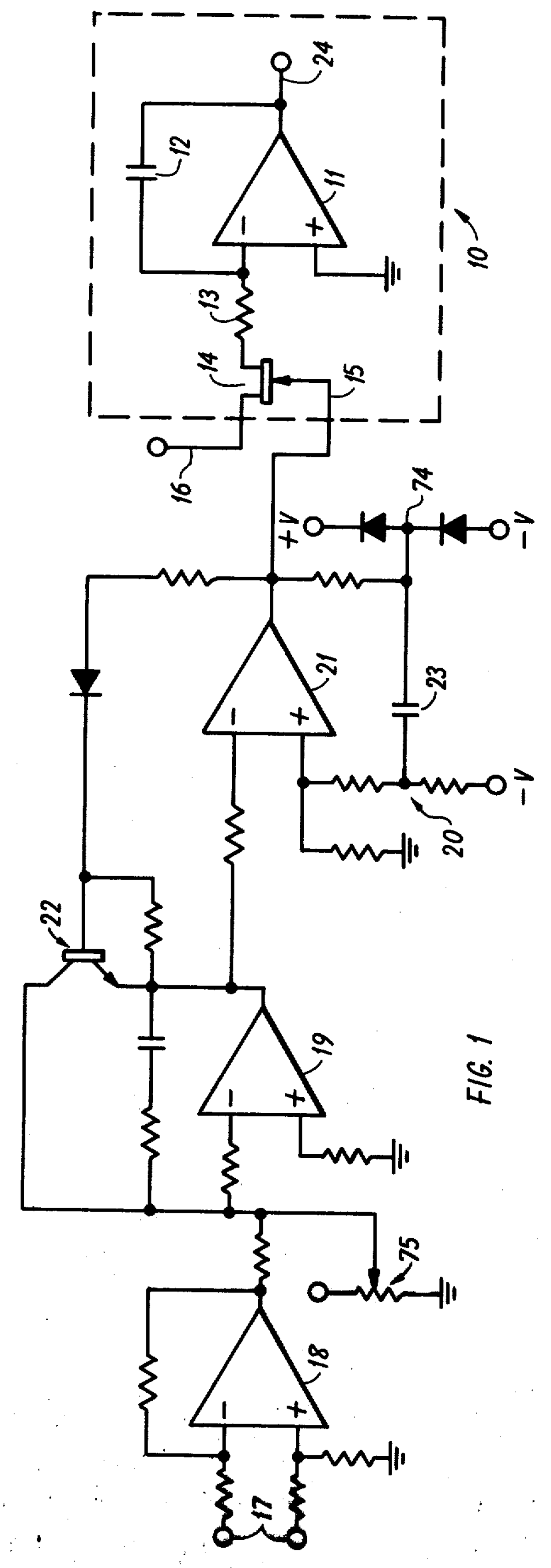
FIG. 1 is a schematic representation of an electronic integrator embodying the instant invention coupled to an electronic pulse generator suitable for varying the time constant of the integrator in response to an applied adjustment voltage.

FIG. 1 shows an integrator outlined in block 10 having a variable time constant. The integrator is composed of amplifier 11, negative feedback capacitance 12, input resistance 13 and an FET input switch 14 in series with input resistance 13. The signal to be integrated is supplied on lead 16 and the integral of the signal is generated on lead 24.

The effective time constant of the circuit shown is given by the following formula:

$$\tau = K\left(\frac{T_1 + T_2}{T_1}\right)(R_1 + R_2 + R_3)\,C$$

where $K$ is a constant depending upon the values of the components used, $T_1$ is the on time of FET 14 and $T_2$ is the off time. These times are illustrated in FIG. 2B. $R_1$ is the effective resistance of the input signal source, $R_2$ is the on resistance of FET 14, $R_3$ is the resistance of input resistance 13 and $C$ is the capacitance of negative feedback capacitor 12. The remainder of the circuitry in FIG. 1 is used to generate fixed width variable spacing pulses for controlling FET switch 14. These pulses are transmitted to FET 14 through lead 15 which is tied to the gate of FET 14.

The width of the generated pulses is determined by component values. The spacing between the pulses is related to the magnitude of the DC voltage applied to input terminals 17. This control voltage is applied through terminals 17 to differential amplifier 18. The output of amplifier 18 is a voltage proportional to the differential input voltage and is applied to integrator 19 along with a bias voltage developed by biasing network 75. The output of integrator 19 is compared to a reference voltage developed across voltage divider 20 in comparator 21. The voltage applied to capacitor 23 is restrained between limits by diode clamp 74. When the output of integrator 19 is more negative than the reference voltage, the output of comparator 21 is in its positive saturation state which is used to reset the integrator by means of shunting switch transistor 22. The output of comparator 21 is fed back to the input reference voltage by capacitor 23. The output of comparator 21 is therefore a series of pulses whose width is determined by the time required to discharge capacitor 23 through voltage divider 20 sufficiently so that comparator 21 may change states. The pulse spacing is determined by the time required for integrator 19 to develop an output more negative than the reference voltage. This time is determined by the time constant of integrator 19 which is fixed and the input voltage to integrator 19 which is related to the adjustment signal applied at terminals 17. The function of this circuitry will be described in more detail in relationship to FIGS. 2A, 2B and 2C.

As can be seen from FIG. 1, the components comprising the integrator, shown in block 10, may be completely protected from the environment by any of the conventional packaging methods such as potting or hermetic sealing. Packaging protection of this sort is possible because the circuit design has eliminated the need for any mechanically adjustable components in order to vary the time constant. Packaging protection of this type is critical at the input to the integrator especially when relativel long time constants are required.

Figure 2A:
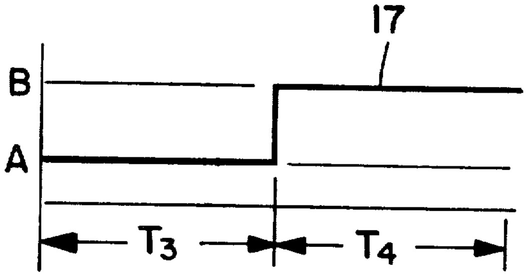
FIGS. 2A, 2B and 2C are a series of graphs having voltage represented on the ordinate and time on the abscissa showing various wave forms related to the circuitry of FIG. 1.
Figure 2B:
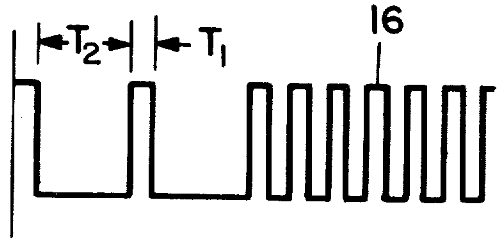
Figure 2C:
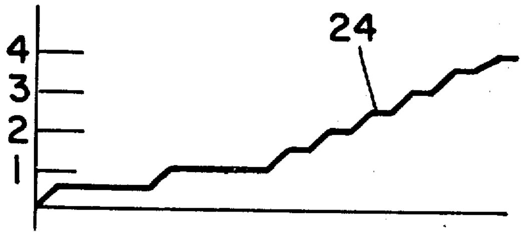

FIGS. 2A, 2B and 2C

FIGS. 2A, 2B, and 2C are a series of three wave forms of voltages appearing on the circ it depicted in FIG. 1. Examination of these wave forms is extremely helpful in understanding the variable time constant integrator.

FIG. 2A shows a wave form applied to input terminals 17 to demonstrate the variable time constant. A low voltage of magnitude A is applied during time period $T_3$ and a higher voltage of magnitude B is applied during time period $T_4$. FIG. 2B shows the resultant pulses generated at the output of comparator 21 which is the output of the pulse generator. The pulses are shown with constant pulse width $T_1$ and variable pulse spacing $T_2$. It may be observed that the pulse width is constant throughout but the pulse spacing $T_2$ is larger during time period $T_3$ when a low adjustment signal is supplied than it is during time period $T_4$ when a higher voltage is applied.

FIG. 2C shows the output of integrator 10 on lead 24. When the pulses are on lead 15, FET 14 conducts and integrator 10 integrates. The resultant wave form shown in FIG. 2C displays the variable effective time constant. During time period $T_3$ the integrator has integrated from zero to relative magnitude 1. During time period $T_4$, equal in length to $T_3$, the integrator has gone from magnitude 1 to magnitude 4. The time constant has therefore decreased by a factor of 3 due to the increased adjustment voltage.

The relative magnitudes and times shown in FIG. 2 are not meant to be representative of all operating conditions of the integrator. For example, in practice it has been convenient to generate pulses of 60 microsecond width with spacing variable from the pulse width up to 1 second. The importance of this method of integrating is especially apparent at the larger pulse spacings.

Conventionally, the 30 minute time constant required of industrial electronic process controllers would be produced by an integrator with an 18 microfarad capacitor and a 100 megohm potentiometer. With the instant invention, it is possible to achieve a 60 minute time constant with a 1 microfarad capacitor and a 100 K ohm series resistor.

With either configuration it is necessary to isolate the input node of the amplifier from leakage currents as low as a few picoamps. Leakage protection at that level is virtually impossible if mechanically adjustable components are required. Isolation of this sort is available by many well known techniques such as encapulation where there are no moving components as with the instant invention.

FIG. 3

Figure 3:
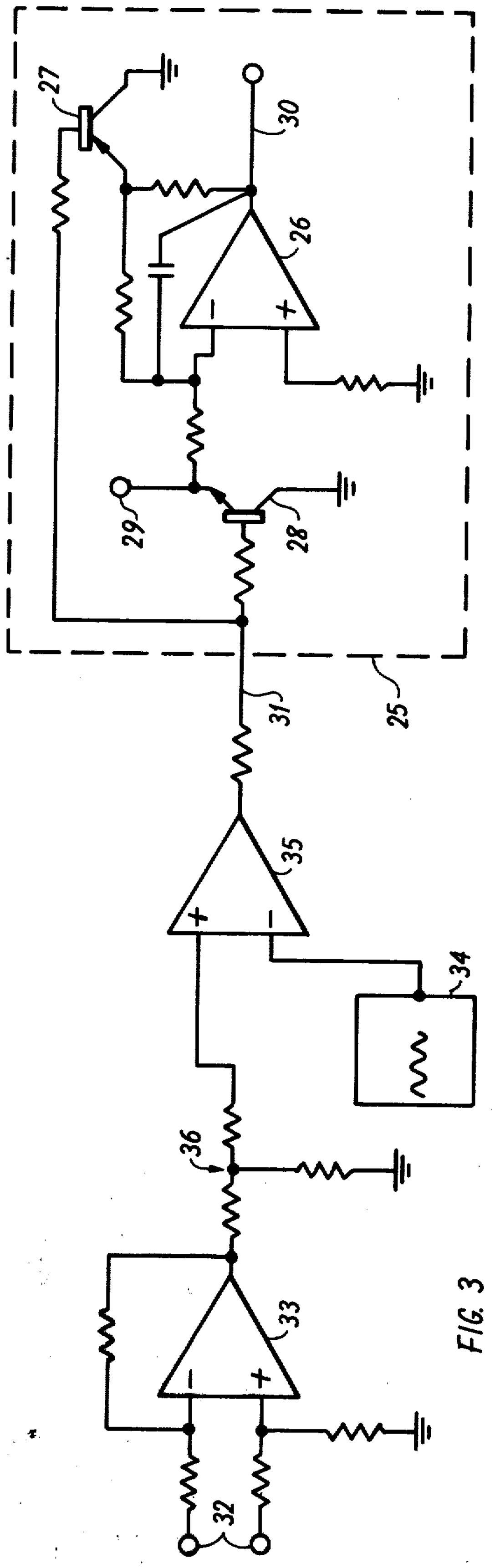
FIG. 3 is a schematic representation of a variable gain amplifier connected to a pulse generator for controlling the gain.

FIG. 3 is the schematic representation of a variable gain amplifying stage controlled by a constant frequency duty cycle pulse generator. In particular, the variable gain amplifying stage 25 contains amplifier 26 in a standard amplifying configuration with the addition of transistor switch 27 connected to pull the feed back of the amplifier to zero and transistor switch 28 connected to ground the input to the amplifying stage. The input is applied on lead 29 and the output generated on the lead 30. The transistor switches are connected through input resistors to lead 31. Transistors 27 and 28 form a complementary pair so that when a positive pulse is supplied through lead 31 transistor 28 will conduct and transistor 27 will not. When a negative pulse is supplied along lead 31 transistor 28 will not conduct but transistor 27 will.

The gain of an amplifier as shown in stage 25 is equal to the feedback resistance divided by the input resistance. It can be observed from the configuration shown that when transistor 28 is on it increases the effective input resistance thereby decreasing the gain. When transistor switch 27 conducts, it increases the effective feedback resistance and increases the gain. Therefore, as will be seen from the wave forms shown in FIGS. 4A, 4B, 4C, 4D and 4E, if a constant frequency pulse train is applied along lead 31, the relative duration of the positive pulse with respect to the negative pulse will control the gain. The longer the positive pulse, the lower the gain; the longer the negative pulse, the higher the gain between leads 29 and 30.

The gain may, therefore, be described by the formula $$G = K \frac{T_8}{T_9}$$

where $K$ is a constant related to the gain the amplifier would have if the transistor switches were not present, $T_8$ is the duration of the positive portion of one cycle of the pulse train, and $T_9$ is the duration of the negative portion. A more complete description of these waveforms and timing is given hereinbelow with reference to FIGS. 4A, 4B, 4C, 4D and 4E.

The remaining circuitry shown in FIG. 3 is just such a constant frequency pulse generator. The input to this pulse generator is applied on leads 32 to differential amplifier 33. The output of amplifier 33 is compared to the output of constant frequency sawtooth of generator 34 in comparator 35. The output of this circuit on lead 31 therefore is a constant frequency pulse train having the same frequency as sawtooth generator 34 whose duty cycle is related to the voltage applied to terminals 32.

FIGS. 4A, 4B, 4C, 4D and 4E

Figure 4A:
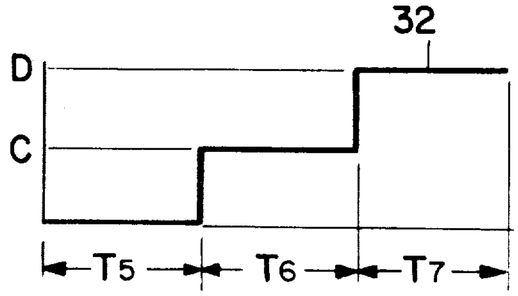
FIGS. 4A, 4B, 4C, 4D and 4E are a series of graphs portraying wave forms related to the circuitry of FIG. 3.
Figure 4B:
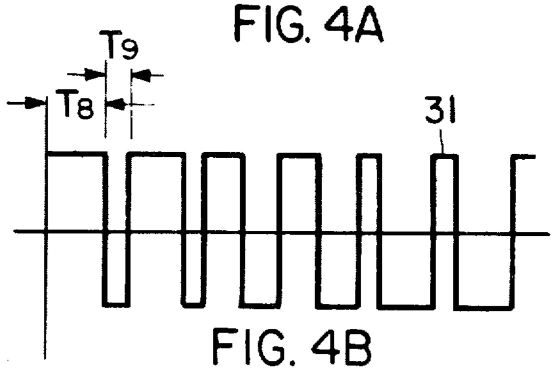

FIGS. 4A, 4B, 4C, 4D and 4E are a series of graphs showing wave forms generated at particular points in the circuitry of FIG. 3 for ease of explanation. FIG. 4A is the graph of a wave form applied to input terminals 32 in order to control the gain of the amplifier 25. During time period $T_5$ no voltage is applied. During time period $T_6$ a voltage of magnitude C is applied. During time period $T_7$ a voltage of magnitude D is applied to input terminals 32. FIG. 4B shows the wave form appearing on output lead 31 of the pulse generator when the wave of 4A is supplied to input leads 32. The output swings from positive saturation voltage of amplifier 35 to negative saturation voltage.

Figure 4C:

When zero voltage is applied during time period $T_5$, the comparator acting on the difference between wave form generated by sawtooth generator 34 and a bias voltage supplied by resistor network 36 produces a constant frequency pulse train on output lead 31 that is more positive than negative as shown in time period $T_5$ of FIG. 4B. During the next time period the voltages applied to comparator 35 yield a constant frequency pulse train that averages approximately zero. During time period $T_7$ when a higher voltage is applied to input terminals 32, the resulting pulse train is mostly negative. FIG. 4C shows when transistor 28 conducts. Obviously it conducts when the pulse train generated along lead 31 is positive. During time period $T_5$ transistor 28 is mostly on, during time period $T_6$ it is on approximately half the time, and during time period $T_7$ transistor 28 is off most of the time.

Figure 4D:

FIG. 4D shows the corresponding conducting and nonconducting states for transistor 27. During the first time period transistor 27 only conducts a small portion of the time, during time period $T_6$ it conducts approximately half the time and during time period $T_7$ it conducts most of the time.

Figure 4E:
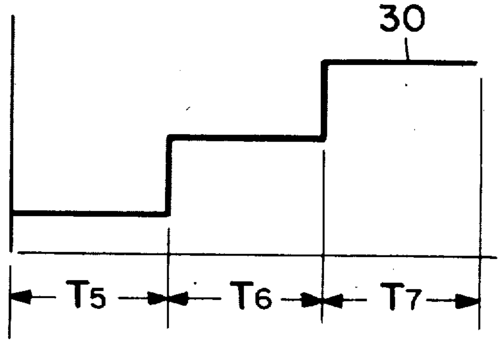

FIG. 4E shows the output of the differential amplifier stage 25 on lead 30 for a constant voltage applied to lead 29 during time periods $T_5$ to $T_7$. There is a minimum gain associated with zero adjustment voltage applied to input terminals 32 and a maximum gain when maximum voltage is applied to input terminals 32.

FIG. 5

Figure 5:
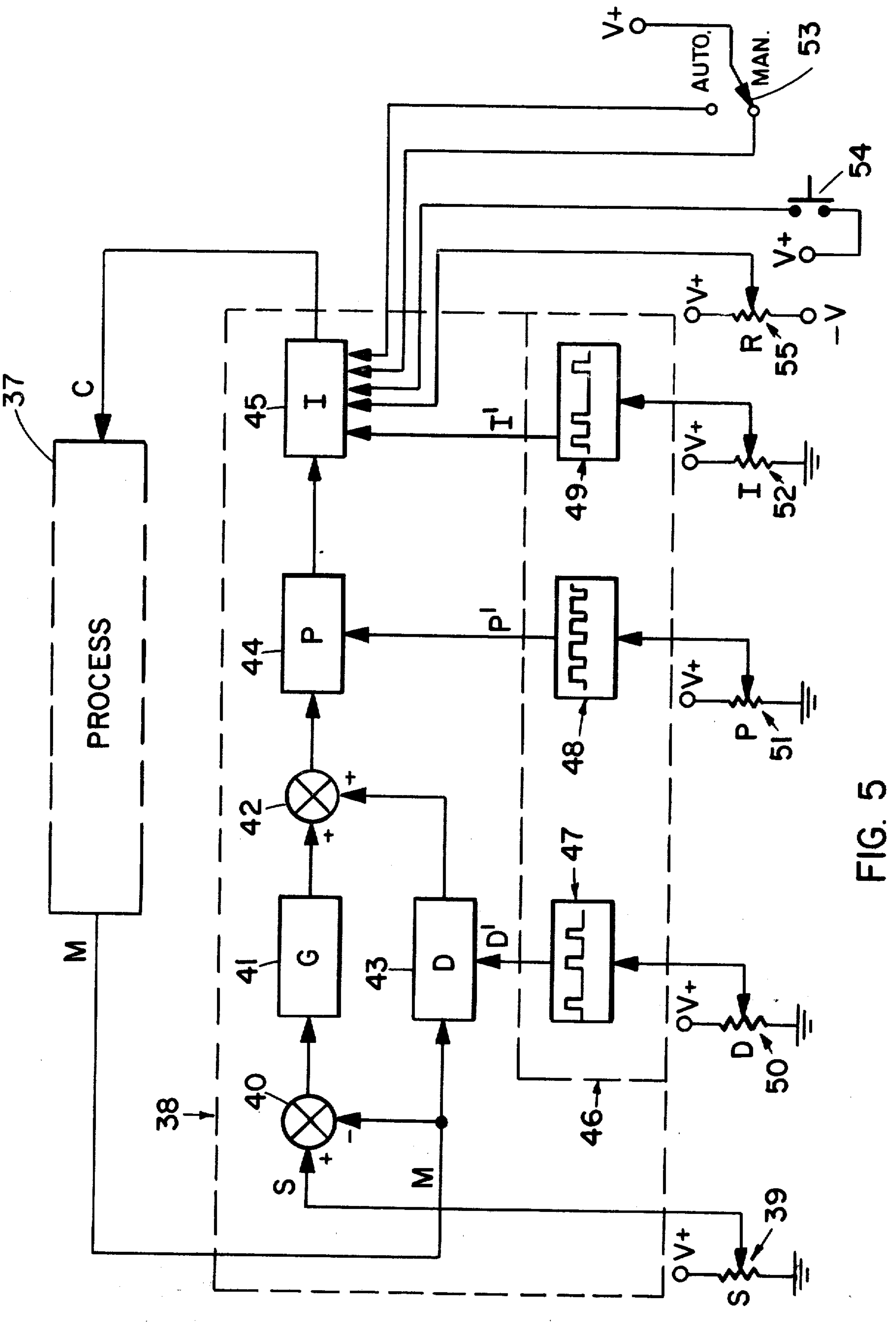
FIG. 5 is a block diagram of an electronic process controller embodying the instant invention utilizing the circuitry of FIGS. 1 and 3.

FIG. 5 is a block diagram of a three mode electronic controller connected to a process embodying the instant invention.

In particular, the process is represented as block 37 having a control input signal C connected to a device under control and a measurement output signal M supplied to controller represented as block 38.

The electronic controller 38 is also supplied with set point signal S generated from voltage supply 39. The deviation between measurement and set point signal is developed in adder 40 which is processed through a constant gain stage 41 and then added to the derivative of the measurement signal developed by derivative circuit 43 in adder 42. The resultant deviation plus derivative signal is processed through proportional band gain stage 44 and then through integrator stage 45 which develops the controller output signal C. Also contained conceptually within controller 38 is pulse block 46. This block contains pulse generator 47 for supplying constant width variable spacing pulses to derivative circuit 43. Pulse generator 48 is also contained in block 46 and generates a constant frequency variable duty cycle pulse train to vary the gain of proportional band amplifier stage 44. Pulse generator 49, similar to generator 47, supplied pulses to control the time constant of integrator 45.

Other inputs to the controller 38 include the voltage signals developed by voltage sources 50, 51 and 52 which control pulse generators 47, 48 and 49 respectively. Further input to controller 38 is auto-manual switch 53, ramp switch 54 and ramp voltage source 55.

Integrator circuit 45 and derivative circuit 43 are constructed from the basic circuit of FIG. 1. Proportional band stag 44 is constructed from the circuitry of FIG. 3. The pulse generators of block 46 are also included in this circuitry of FIGS. 1 and 3.

The functions of integrator block 45 and proportional band stage 44 have previously been discussed with reference to FIGS. 1 and 3 respectively. Derivative circuit 43 is comprised of a simple amplifying stage with an integrator similar to block 10 in the feedback loop. The major difference is that the pulse generator 47 is required to produce an increased pulse spacing for increase adjustment voltage whereas the pulse generator 49, as well as the pulse generator shown in FIG. 1, is required to provide decreased spacing with increased adjustment voltage. This may be accomplished by reversing the polarity of the input on leads 17 in FIG. 1. In addition, an extra biasing network is added to the input of amplifier 18 in FIG. 1 so that the adjustment voltage must overcome the negative bias voltage. This arrangement is required so that if the adjustment voltage is lost through a broken cable or other means, the derivative circuit will be supplied with a continuous signal from pulse generator 47 whose pulse spacing is a minimum thereby effectively removing the derivative term from the controller output signal C. Similarly, as shown, the spacing of the pulses applied to integrator 45 goes to a maximum if the adjustment voltage is lost so that the effect of the integral term is removed.

The details of the various interconnections, without further reference to the pulse generator, contained in block 46 are contained hereinbelow with reference to FIG. 6.

It should be noted that various other configurations such as the time sharing of the pulse generators in block 46 between many controllers is equally possible with the instant invention.

FIG. 6

Figure 6:
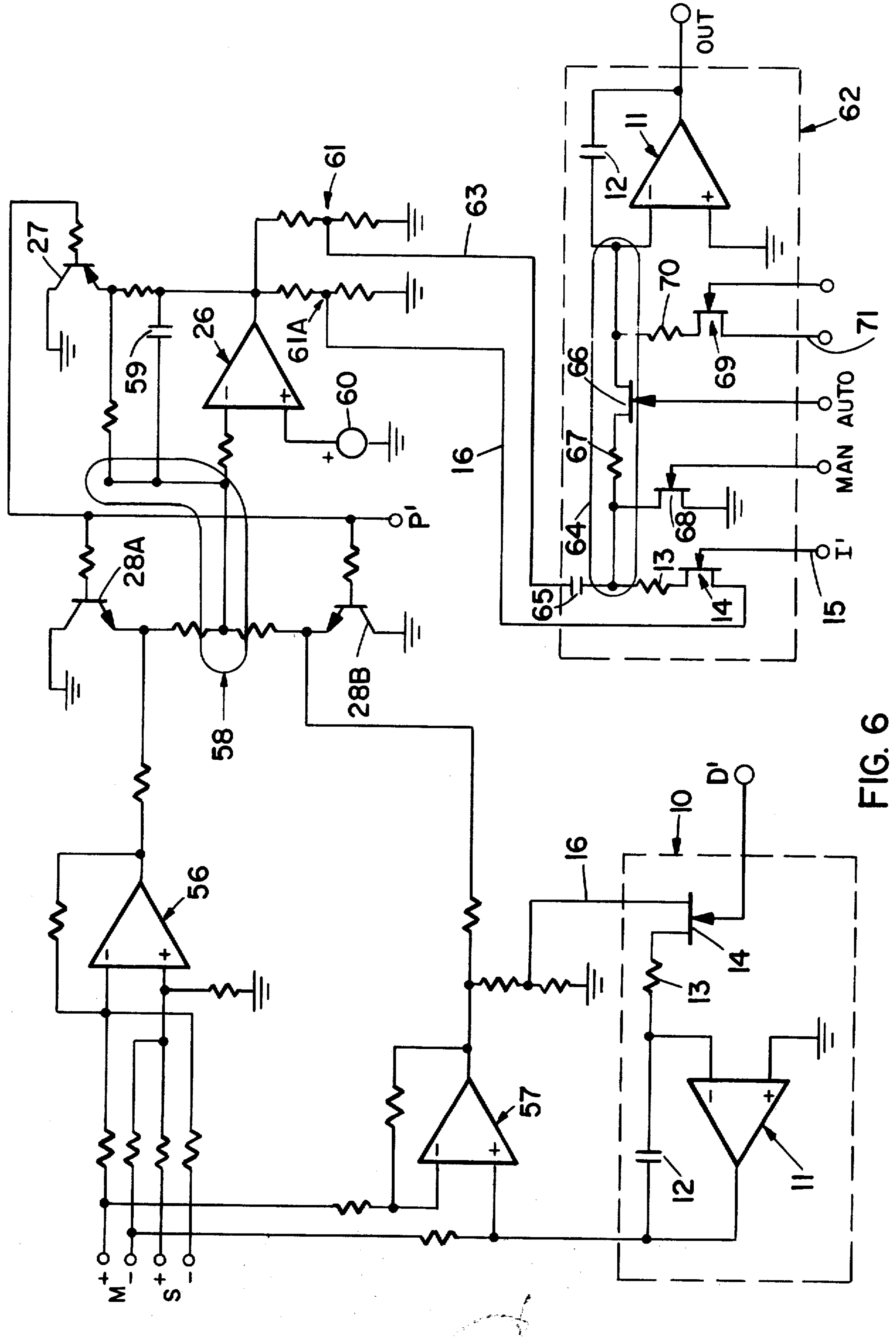
FIG. 6 is a schematic of a particular embodiment of the controller of FIG. 5.

FIG. 6 is a schematic representation of a three mode controller embodying the instant invention as shown in FIG. 5 minus the pulse generators. Differential amplifier 56 to which is connected the measurement and set point signals is a differential amplifier which provides the functions of adder 40 and amplifier 41 of FIG. 5. Variable time constant integrator 10 is shown in the feedback loop of amplifier 57. The input to amplifier 57 is measurement signal M and the output is the derivative of that measurement signal, plus a lag whose time constant is one ninth that of the derivative term. The outputs of amplifiers 56 and 57 are summed in current summing node 58 which is the input to amplifier 26. Both of the signals added at this input node may be switched to ground through respective switching transistors 28A and 28B. The feedback resistance of amplifier 26 may be shorted to ground through transistor switch 27. The negative feedback loop of amplifier 26 further contains capacitor 59 which serves to filter the output of amplifier 26. To the noninverting input of amplifier 26 is supplied biasing source 60 to compensate for the offset present at node 58. The output of amplifier 26 and therefore the proportional band stage is divided into two resistance legs 61 and 61A. These are both connected to integrator module 62 which is identical to integrator module used in the derivative circuit but further contains a series of FET switches and resistances for switching between automatic and manual modes of operation of the controller, and capacitor 65 for the proportional signal.

The integrator in block 62 is comprised of amplifier 11, negative feedback capacitor 12, input resistance 13 and FET input switch 14 shown as identical to those in integrator module 10. These components serve to integrate the signal present on lead 16 from resistance leg 61A of the proportional band amplifier. The integration is controlled by the pulse signal supplied on lead 15 labeled I'.

The proportional signal, which is the AC component of the signal developed at the output of amplifier 26, is supplied to the output stage 62 from resistance leg 61 along lead 63. This signal is coupled to summing node 64 at the input of the amplifier through capacitor 65. Capacitor 65 may be viewed as as AC bypass around switch 14. This arrangement allows the integral signal, the DC component of the signal developed at the output of amplifier 26, to be controlled by switch 14 without impeding the processing of the proportional band signal through the same output amplifier.

It is apparent, therefore, that the same output amplifier 11 may be used as a variable time constant integrator for the integral signal and as a fixed gain amplifier for the proportional signal. The integral signal depicted in FIG. 2C is superimposed upon the AC or proportional band signal on the output lead OUT. The gain of the proportional band signal is controlled in the manner described hereinabove with reference to amplifier 26 but is affected by the ratio of capacitors 65 and 12.

With reference again to FIG. 5 the control signal C contains an AC term comprised of the proportional band signal, the relative amplification of which is varied by pulse generator 48 and the derivative signal the time constant of which is controlled by pulse generator 47, and a DC term, the integral signal whose time constant is controlled by pulse generator 49.

Node 64, at the input of amplifier 11, is split in half by FET 66 which when conducting allows amplifier 11 to serve as an integrator and allows the controller to perform in the automatic mode. It is in series with current limiting resistor 67. Connected to the signal side of FET 66 is FET 68 which serves to short the signal side of node 64 to ground so that capacitor 65 will charge to the deviation voltage while in manual mode allowing transfer to auto mode without a bump. On the amplifier side of node 64 is FET 69 in series with current limiting resistor 70. If FET 68 is conducting and FET 66 is not, the controller is in the manual mode and the output voltage is equal to the voltage across capacitor 12. To vary this voltage a signal may be supplied to the amplifier side of node 64 along lead 71 if FET 69 is conducting.

Therefore, as is shown in the above description and the accompanying drawings, a three mode electronic process controller is provided that is remotely tunable by electronic signals. The time constants of the integral and derivative modes and the gain of the proportional band stage may all be individually adjusted by separate analog DC voltage signals. In addition, the controller may be transferred in a balanceless bumpless fashion between automatic and manual modes of operation by switching a constant DC voltage from a manual lead to an automatic lead. Further, the output voltage may be directly controlled, as in manual operation, by an analog voltage applied directly to the output circuit of the controller but gated by a DC voltage signal.

The packaging protection for the integrator, as originally described in relation to integrator 10 of FIG. 1, is especially beneficial with respect to integrator 62. In particular, it is important to the proper functioning of this unit to protect node 64 from degradation and leakage. This protection is allowed by the elimination of the need for mechanical components and may be provided by any suitable package method such as potting or hermetic sealing.

FIG. 7

Figure 7:
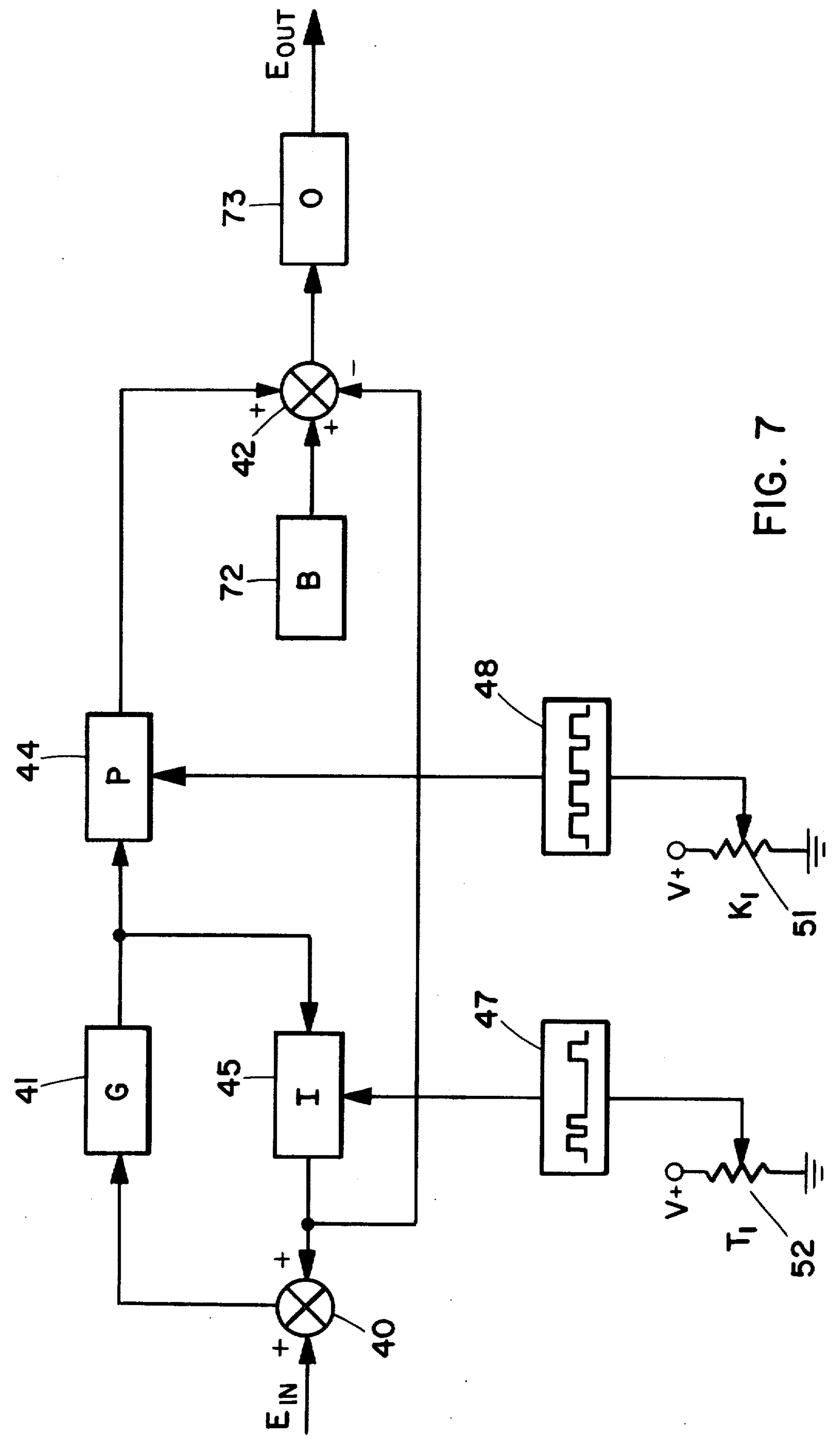
FIG. 7 is a block diagram of a lead-lag unit.

FIG. 7 is a representation in block diagram form of a dynamic compensator or lead-lag unit constructed from the same circuits as the controller shown in FIG. 5. In particular, a lead-lag unit of this type may be considered to be a controller having a different transfer function than the PID controller shown above.

In the lead lag unit shown the input voltage $E_{in}$ is one input of adder 40 the output of which is connected to a constant gain or buffer stage 41. The output of this stage becomes the input to a variable time constant integrator 45. The pulse train for integrator 45 is generated by pulse generator 47 which is controlled by voltage source 52.

The output of integrator 45 is connected to input adder 40 previously mentioned and also to output adder 42.

The output of buffer 41 is also processed by proportional amplifier 44 whose gain is adjusted by a pulse train supplied by pulse generator 48 which is controlled by voltage source 51. The output of the proportional amplifier 44 is connected to output adder 42 with the output of integrator 45 previously mentioned and along with an additional bias voltage supplied by bias generator 72 which may conveniently be merely a voltage source. The output of adder 42 is processed by output stage 73 which will vary dependent upon the requirements of the rest of the system.

The output voltage $E_{out}$ will be a function of the input voltage $E_{in}$ multiplied by a lead or lag function depending upon the setting $K_1$ of the gain control voltage source 51. The time constant $\tau_1$ of the lead or lag function is determined by the time constant of integrator 45. This time constant is varied by the pulses from pulse generator 47 which is controlled by voltage source 52. The output also contains a bias term $E_B$. The transfer function of this circuit is then seen to be $$E_{out}(S) = E_{in}(s)\,\frac{K_1\tau_1 s+1}{\tau_1 S + 1} \pm E_B$$

Although a preferred embodiment of the invention has been shown, many additions, deletions or alterations to the circuitry may be made without departing from the scope or spirit of the invention. In particular by simply grounding the signal present at the output of amplifier 57 in FIG. 6 the three mode P.I.D. controller becomes a two mode P.I. controller. Similarly it is well within the ability of a man having ordinary skill in this art to convert the embodiment shown in FIG. 6 to a Proportional only or Integral only controller or into any of the usual variations therefrom.

Similarly, the remotely tunable time constant integrator may be used in other electronic equipment of the same general kind such as manual stations, batch controllers, autoselector systems, etc., without departing from the scope or spirit of this invention.

Still further it would be a simple matter to utilize other types of pulse trains to control the time constants and gains. It is important only to control the average relationship between time on and time off of the electronic switches.

I claim:

1. An electronic process controller responsive to an electrical measurement signal representing the magnitude of a condition of an industrial process and having an output circuit which produces an electrical control signal for operating a device associated with the process under control so as to maintain said condition at a desired set point value, said controller comprising in combination;

adjustable means to develop a set signal representing the desired value of the controlled condition;

comparison means for comparing said set signal and said measurement signal to produce a deviation signal indicating the amount by which said condition differs from said desired set point value;

signal processing means having an input coupled to said comparison means and responsive to the deviation signal produced thereby, said signal processing means including proportional-band amplifier means and integral means interconnected with said signal processing means input to produce on the controller output circuit a composite output signal having both proportional and integral components;

means for selectively setting the gain of said proportional-band amplifier means;

said integral means comprising an electronic amplifier having an input and an output;

a negative feedback circuit including integrating capacitor means coupling the output of said electronic amplifier to its input;

an integrating resistor connected to said electric amplifier input;

circuit means forming part of said signal processing means and connected to said integrating resistor to supply to the end thereof which is remote from said amplifier input a signal responsive to said deviation signal and thereby to direct to said integrating capacitor a current corresponding to the current developed through said integrating resistor in response to said deviation signal;

said integrating resistor and feedback capacitor means cooperating to develop at said amplifier output a signal representing the time-integral of the signal supplied to said resistor;

means to couple said electronic amplifier output to said controller output circuit to provide thereto a signal including said integral component;

electronic switch means connected to said integrating resistor and operable when actuated to interrupt said flow of current through said resistor;

pulse-generating means coupled to said switch means for actuating said switch means so as to interrupt said current flow during the time of each pulse; and adjustable means coupled to said pulse-generating means to vary the frequency of said pulse without correspondingly altering the pulse duration, thereby to alter the effective time-constant of said integral means and change the amount of said integral component in said composite output signal directed to said control device.

2. The process controller of claim 1 wherein said proportional band amplifier means has its input coupled to the output of said comparison means and is responsive to said deviation signal to provide proportional gain;

means coupling the output of said proportional band amplifier means to said remote end of said integrating resistor of said integral means to develop said current through said resistor;

a second electronic switch connected with the signal input of said proportional band amplifier; and a second pulse generator having an electrically variable duty cycle for generating fixed frequency pulses utilized to activate said second switch so that the gain of said proportional band amplifier is controlled by the duty cycle of said second pulse generator.

3. The process controller of claim 1 wherein the means to set the effective gain of said proportional band means comprises a proportional band amplifier with its input coupled to the output of said comparison means and responsive to said deviation signal to provide proportional gain;

an input resistor and a feedback resistor connected to one input terminal of said proportional-band amplifier to determine the gain of said amplifier in accordance with the ratio of effective resistances thereof;

a pair of electronic switches interconnected to provide alternate operation such that when one switch is open the other is closed and vice versa, one of said alternately operating switches being connected with the signal input and the other being connected with the signal output of said proportional band amplifier to disable the input and output alternately and correspondingly alter the effective resistances of said input and feedback resistors of said proportional band amplifier in accordance with the relative amounts of times the switches disable the input and output respectively; and a second pulse generator having an electrically variable duty cycle for generating fixed frequency pulses utilized to alternately activate said pair of switches so that the gain of said proportional band amplifier is controlled by the duty cycle of said second pulse generator.

* * * * *